United States Patent [19]
Smith

[11] Patent Number: 5,900,637
[45] Date of Patent: May 4, 1999

[54] MASKLESS LITHOGRAPHY USING A MULTIPLEXED ARRAY OF FRESNEL ZONE PLATES

[75] Inventor: Henry I. Smith, Sudbury, Mass.

[73] Assignee: Massachusetts Institute of Technology, Cambridge, Mass.

[21] Appl. No.: 08/866,550

[22] Filed: May 30, 1997

[51] Int. Cl.⁶ .................................................. H01J 37/317
[52] U.S. Cl. ...................................... 250/492.22; 378/34
[58] Field of Search ..................... 250/492.22, 492.23, 250/492.24, 492.2, 398; 378/34, 35

[56] References Cited

U.S. PATENT DOCUMENTS

| | | | |
|---|---|---|---|
| 4,023,904 | 5/1977 | Sheets | 250/492.2 |
| 4,815,854 | 3/1989 | Tanaka et al. | 356/356 |
| 4,947,413 | 8/1990 | Jewell et al. | 250/492.2 |
| 5,424,549 | 6/1995 | Feldman | 250/492.22 |

OTHER PUBLICATIONS

J. Vac. Sci. Technol. B 14(6) Nov./Dec. 1996, pp. 4009–4013, "Analysis of Distortion in Interferometric Lithography", by Ferrera et al.

*Primary Examiner*—Kiet T. Nguyen
*Attorney, Agent, or Firm*—Samuels, Gauthier & Stevens

[57] ABSTRACT

An array of Fresnel zone plates is illuminated by parallel beamlets of narrow-band electromagnetic radiation. The individual zone plates focus a significant fraction of the incident radiation to foci on a substrate located at least several micrometers distant. The beamlets are capable of being individually turned on or off by shutters, or by deflecting small mirrors that would otherwise direct a beamlet to its Fresnel zone plate. Pattern generation is accomplished by moving the substrate while multiplexing the individual beamlets on or off.

30 Claims, 3 Drawing Sheets

MASKLESS LITHOGRAPHY USING A MULTIPLEXED ARRAY OF FRESNEL ZONE PLATES

This invention was made with government support under Grant No. DAAH04-95-1-0038 awarded by the U.S. Army and Grant No. N00019-95-K-0131 awarded by the U.S. Navy. The government has certain rights in the invention.

BACKGROUND OF THE INVENTION

The invention relates to maskless lithography using a multiplexed array of Fresnel zone plates.

Lithography is conventionally performed by a variety of systems and methods. Optical projection lithography employs a reticle (also called a mask) which is then imaged onto a substrate using either refractive or reflective optics, or a combination of the two. The reticle or mask contains the pattern to be created on the substrate, or a representation thereof. Often, but not always, the optics produces a reduction of the reticle image by a factor between 4 and 10. In other cases there is no reduction of magnification, often referred to as 1-to-1 imaging.

X-ray lithography employs a mask held in close proximity (e.g., a gap of zero to 50 micrometers) to the substrate. By passing x-ray radiation through the mask, the pattern on the mask is replicated in a radiation-sensitive film on the substrate. This film is commonly called a "resist".

Electron-beam lithography is often carried out by scanning a well focused electron beam over a substrate coated with a resist. By turning the beam on and off at appropriate times, in response to commands from a control computer, any general 2-dimensional pattern can be created. This form of electron-beam lithography is referred to as a "maskless lithography", since no mask is employed. The pattern is created sequentially, dependent upon commands from a control computer.

Another form of maskless lithography, commercially available from ETEC Corporation of Hayward, Calif., employs an array of light beams which scan across a substrate and are shut on and off in response to commands from a control computer. This system is referred to as an optical pattern generator. The resolution of this system is limited by the numerical aperture of the lenses used and the wavelength of the ultraviolet radiation, in accordance with a well-known relationship:

$$p = \lambda/NA$$

where p is the minimum resolvable period, $\lambda$ is the wavelength of the radiation, and NA is the numerical aperture of the lens.

Lithography methods that create a pattern via commands from a control computer have a significant advantage over those that require a mask.

X-ray lithography is considered an attractive approach to manufacturing semiconductor products with minimum size features of 100 nm and below, because of its capabilities for high resolution. For example, linewidths as narrow as 18 nm have been replicated with x-ray lithography. Another attractive feature of x-ray lithography is a near absence of backscattering from the substrate. However, the difficulty and cost of making the x-ray mask, and the problem of distortion in the pattern on the mask due to the stresses in the x-ray absorbing material that forms the pattern, and the lack of stiffness in the membrane that supports the absorber pattern, are considered potential impediments to utilization.

Another potential problem with x-ray lithography, which arises especially when sub-100 nm features are to be replicated, is that the mask-substrate gap, G, must be decreased in accordance with the approximate relationship:

$$G = \alpha W^2/\lambda \qquad (1)$$

where W is the minimum feature size, $\lambda$ is the x-ray wavelength, and $\alpha$ is in the range 1 to 1.5. For feature sizes below 50 nm, for example, the gap must be below 4 micrometers. Although such gaps, and even mask-substrate contact, are feasible in research, it is questionable whether this would be acceptable in manufacturing. Clearly, it would be desirable to develop a form of x-ray lithography that avoided the necessity of making a mask and the necessity of utilizing a small gap. This is accomplished by the present invention.

SUMMARY OF THE INVENTION

Accordingly, it is an object of this invention to provide a system and method of performing maskless lithography that preserves the attractive high-resolution capabilities of x-ray lithography. The invention images incident beamlets of electromagnetic radiation by means of Fresnel zone plates. The imaging properties of Fresnel zone plates have been understood since the late 19th century. Zone plates have been used for many years in x-ray microscopy in the wavelength range around 2.4 nm. Burge, Browne and Charalambous were the first to propose the use of a zone plate in x-ray lithography, as described by Burge et al., Microelectronic Engineering 8, 227–32 (1987). However, they employed only a single zone plate and described reduction imaging of a pattern on a mask. Their field-of-view was extremely small. To circumvent the problem of the very limited field-of-view of zone plates, Hector and Smith (S. D. Hector and H. I. Smith, OSA Proceedings on Soft-X-ray Projection Lithography, Eds. A. M. Hawryluk and R. H. Stulen (Opt. Soc. Amer., Washington, D.C.) 18, 202 (1993)), and M. Feldman (M. Feldman, OSA Proceedings on Soft-X-ray Projection Lithography, Eds. A. M. Hawryluk and R. H. Stulen (Opt. Soc. Amer., Washington, D.C.) 18, 207 (1993)) proposed two different lithography schemes using arrays of zone plates. However, both of these schemes required a mask. They were not maskless pattern generators. It is an object of this invention to achieve maskless pattern generation.

Moreover, the Hector & Smith, and Feldman schemes required two zone-plate arrays in tandem. Because the focusing efficiency of zone plates in the x-ray regime is in the range 10 to 33%, the need for two tandem arrays implies an overall efficiency of only 1 to 9%, at best. That is, only 1 to 9% of the input x radiation actually contributes to image formation. The invention employs a single zone-plate array, it being an object of this invention to achieve high efficiency of exposure and high throughput.

The invention provides a system and method of performing lithography without the need for a mask that contains the pattern to be exposed. More specifically, it employs an array of Fresnel zone plates to focus parallel beamlets of electromagnetic radiation so that they converge to foci on a substrate. The beamlets can be individually turned on or off by means of shutters that obstruct a beamlet, or by deflecting small mirrors that would otherwise direct a beamlet to its Fresnel zone plate. Pattern generation is accomplished by moving the substrate while multiplexing the individual beamlets on or off by means of electrical or optical signals.

According to the invention, an array of Fresnel zone plates is illuminated by parallel beamlets of narrow-band electromagnetic radiation. The individual zone plates focus a significant fraction of the incident radiation to foci on a substrate located at least several micrometers distant. The beamlets are capable of being individually turned on or off by shutters, or by deflecting small mirrors that would otherwise direct a beamlet to its Fresnel zone plate. Pattern generation is accomplished by moving the substrate while multiplexing the individual beamlets on or off.

DETAILED DESCRIPTION OF THE ILLUSTRATED EMBODIMENTS

The invention provides the design considerations for a maskless, zone-plate-array lithographic scheme aimed at achieving the highest possible resolution. For sub-100 nm lithography, the most appropriate electromagnetic wavelength to use, from the point of view of resist exposure, is either 4.5 nm, at the carbon K absorption edge, or around 1 nm. At the $C_K$ edge, resists such as polymethyl methacrylate (PMMA), which are composed primarily of C and H, attenuate only about 2 dB per micrometer, and hence resist thickness can be a large fraction of a micrometer. The 1 nm wavelength is also compatible with thick resist.

The intrinsic resolution at the 4.5 nm wavelength is ~5 nm, which is probably at or just beyond the practical limit of the lithographic process itself. For zone-plate-array maskless projection lithography, 4.5 nm is the optimal wavelength from the points-of-view of resolution, source characteristics, zone plate fabrication, and absence of spurious effects. At a wavelength of 1 nm, somewhat poorer resolution would be achieved because of the larger range of photoelectrons generated by the 1 nm x-rays in the resist and from the substrate. Moreover, the zone plates appropriate for 1 nm wavelength are more difficult to fabricate, and the x-ray sources are less efficient.

Figure 1:
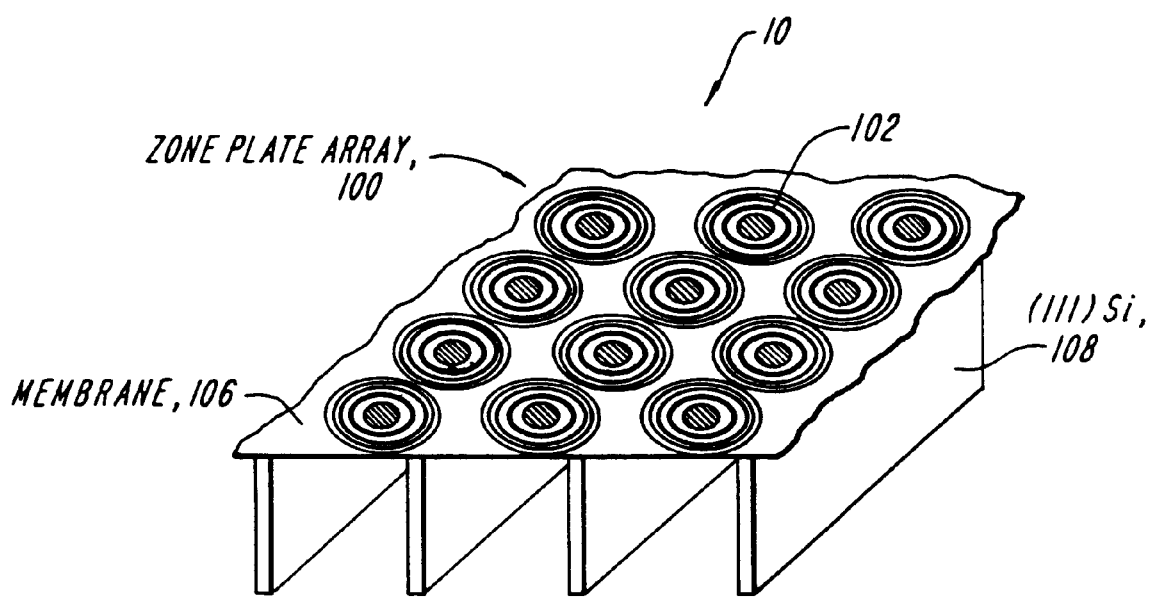
FIG. 1 is a perspective view of an array of Fresnel zone plates configured on a silicon substrate in accordance with the invention.

With reference now to the FIG. 1, a maskless lithography arrangement 10 in accordance with the invention which includes an array 100 of Fresnel zone plates 102 configured on a (110) silicon substrate (not shown). Each zone plate 102, which defines a "unit cell", is supported on a thin carbonaceous membrane 106, with vertical, anisotropically-etched Si (111) joists 108 for rigid mechanical support. Each zone plate 102 is responsible for exposure only within its unit cell.

The joists 108, which in the illustrated exemplary embodiment are made of (111) Si, are intended to provide additional rigidity to the array while minimizing obstruction. Methods of anisotropic etching of silicon are well known, and are capable of producing in (110) Si joists about one or a few micrometers thick. In alternative embodiments of this invention, the joists would not be necessary, thus the substrate need no be (110) Si.

The membrane 106 is made of thin carbonaceous material because it is transparent to a beam source of 4.5 nm x-ray.

If deep UV radiation is used, the membrane can be made of glass, and the zone plates could be made from phase zone plates, i.e. grooves cut into the glass membrane.

Figure 2:
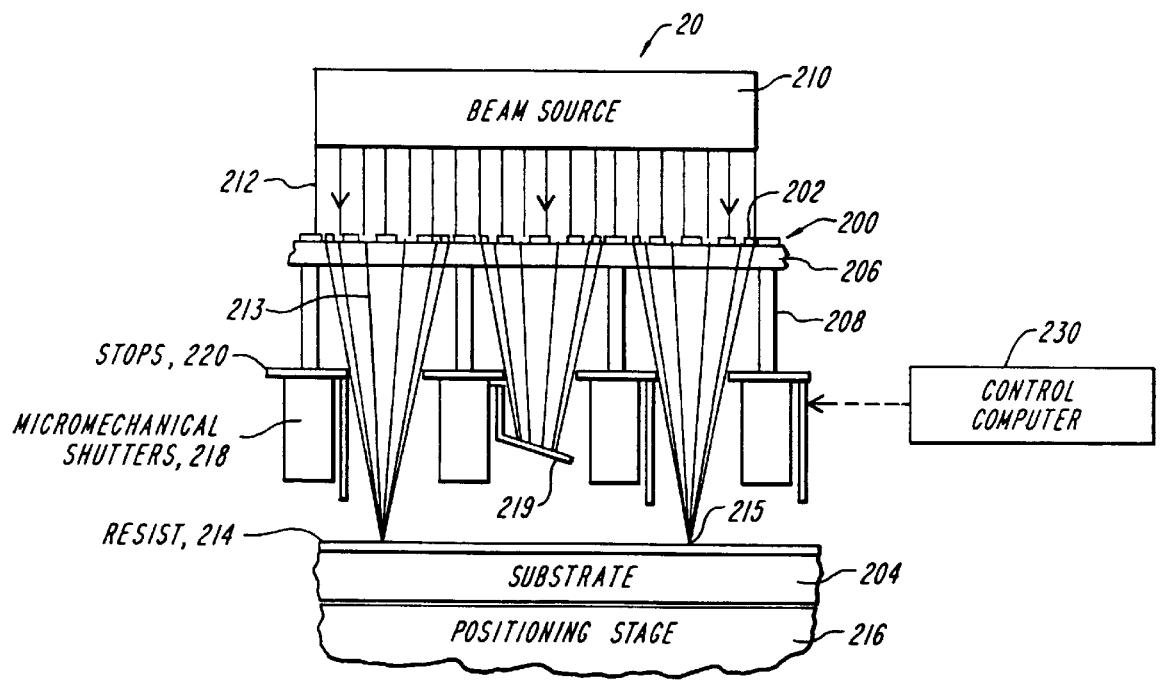
FIG. 2 is a cross-sectional schematic view of an exemplary embodiment illustrating the focusing of incident beamlets onto a resist-coated substrate.

FIG. 2 is a cross-sectional schematic view of an exemplary embodiment of a maskless lithography arrangement 20 in accordance with the invention illustrating the focusing of incident beamlets 212 from an x-ray beam source 210 onto a substrate 204 coated with a resist 214 as focused beamlets 213. The arrangement includes micro-mechanical shutter devices 218 with actuated shutters 219, which turn the focused beamlets on and off in response to commands from a control computer 230. The shutter devices 218 are interposed between the zone-plate array 200, joists 208, stops 220, and the substrate 204. The second beamlet from the left is indicated as being in the off state.

As illustrated in FIG. 2, each of the zone plates 202 of the array 200 is able to focus a collimated beamlet 212 of x-rays to a fine focal spot 215 on the resist-coated substrate 204 which is supported on a positioning stage 216. To write a pattern, the substrate is scanned under the array, while the individual beamlets 213 are turned on and off as needed by means of the micromechanical shutters 218, one associated with each zone plate. These shutters can be located either between the zone plate array and the substrate, i.e., "downstream", as illustrated in FIG. 2, or between the zone plate array and the source of radiation, i.e., "up-stream", as implied in FIG. 3.

Figure 3:
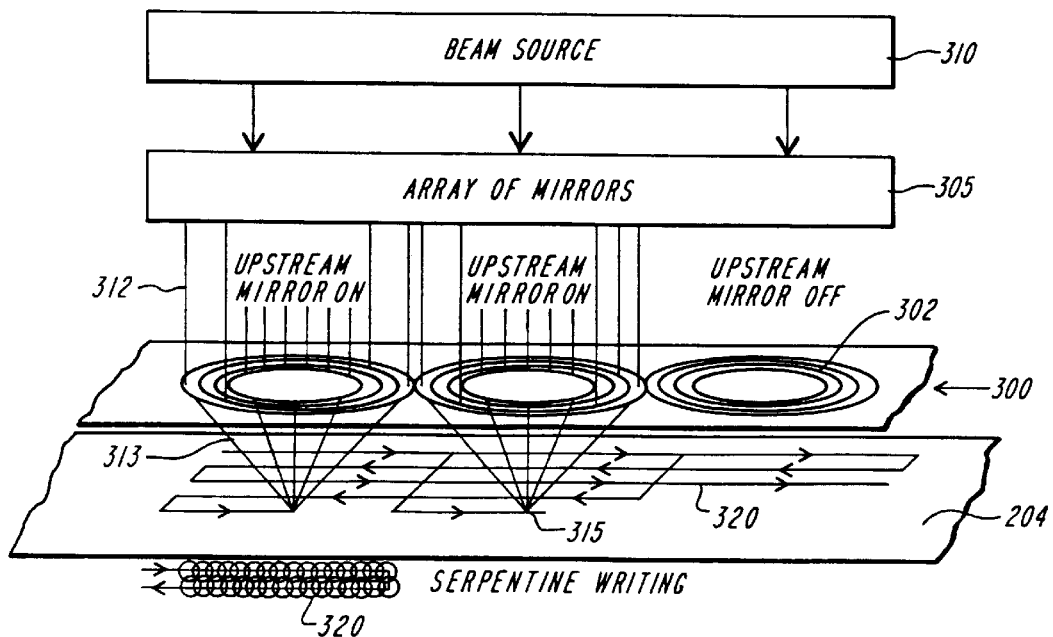
FIG. 3 is a schematic illustration of an exemplary writing scheme in accordance with the invention.

FIG. 3 is an illustration of one possible writing scheme used in connection with an exemplary embodiment of maskless lithography arrangement 30. The arrangement includes an array of upstream mirrors 305 positioned between the array 300 of Fresnel zone plates 302 and the radiation source 310. A serpentine writing scheme 320 is depicted, with the substrate scanned in X and Y by a fast piezoelectric system (not shown), thereby filling in the full pattern.

Radiation of 4.5 nm wavelength is readily reflected at glancing angles from a polished surface. Accordingly, an array of micromechanical, deflectable glancing-angle mirrors 305, located upstream, can be used to turn individual focused beamlets 313 on and off. Texas Instruments, Inc. has developed a visible-light projection display system that employs an array of deflectable micromechanical mirrors. Hence the technology for fabricating and deflecting such micromechanical mirrors is known in the art.

There are various strategies through which the scanning and writing can be done. One is to employ a square array of zone plates, as depicted in FIG. 1, with each zone plate writing only within its "unit cell". The scanning in this case would be serpentine, as depicted in FIG. 3, with the positioning stage moving only a distance equal to the unit cell edge dimension ($\leq 10 \mu m$) in X and Y until all pixels within the unit cell are addressed, and either written (i.e., shutter open) or not (i.e., shutter closed). The entire array would then be stepped a distance equal to the array size and scanning repeated. An alternative to a this "step-and-scan" strategy, is a linear-scan strategy similar to that described by M. Feldman, OSA Proceedings on Soft-X-ray Projection Lithography, Eds. A. M. Hawryluk and R. H. Stulen (Opt. Soc. Amer., Washington, D.C.) 18, 207 (1993), incorporated herein by reference. In Feldman's scheme, a close-packed array of zone plates would be azimuthally rotated relative to the scanning direction in such a way that all pixels can be addressed when the substrate is scanned along one direction only.

In order that lithographic features which cross boundaries between unit cells are free of stitching errors, it is necessary that the zone plates be arranged in the array with a placement precision much finer than a pixel diameter. Spatial-phase-locked e-beam lithography, as described by Ferrera et al., J. Vac. Sci. Technol. B 11, 2342–2345 (1993), incorporated herein by reference, can be used to accomplish this.

The principle of operation of Fresnel zone plates is well known to those of skill in the art. A zone plate can be thought of as a structure of circular symmetry in which the local spatial period depends on radius in such a way that first-order diffracted radiation from any radius value crosses the axis at the same point, i.e., the focal length. For a plane wave incident, the equation that describes the relationship among the first-order focal length f, the zone number n, and the zone radius $R_n$ follows from the Pythagorean theorem and the condition for constructive interference:

$$(R_n)^2 + f^2 = [f + n\lambda/2]^2, \qquad (2)$$

where $\lambda$ is the wavelength. Letting p represent the "pitch" or period of the outermost zones, the maximum angle of convergence to focus, $\theta$, for a plane wave incident is given by $$\sin\theta = \lambda/p. \qquad (3)$$

Just as transmission diffraction gratings can be based on periodic obstruction or periodic phase shifting, so also zone plates can be based on obstruction ("amplitude" zone plates) or phase shifting ("phase" zone plates), and all intermediate types as well. Pure phase zone plates have a focusing efficiency of 40%, whereas amplitude zone plates focus only 10% of the incident radiation into the positive first-order focus. Since zone plates are based on diffraction, they are subject to chromatic aberration. That is, different wavelengths are focused at different axial distances. A zone plate will produce a diffraction-limited focal spot only for radiation in a bandwidth BW given by $$BW = 1/N, \qquad (4)$$

where N is the total number of zones.

The starting point of the design of a zone-plate-array pattern generator is the x-ray source, since its bandwidth dictates other system parameters. The optimal source of 4.5 nm radiation for the zone-plate-array pattern generator is an undulator attached to a synchrotron. Such sources, which consist of a linear array of alternating magnetic fields inserted into a straight section of a synchrotron orbit, have bandwidths given by an equation identical to equation (4), except that N in this case is the number of periods of the alternating magnetic field, $N_u$.

In modern undulators, permanent magnets are used with magnetic field strengths ~0.35T, and N, between 35 and 100. The number of zones in the zone plates is therefore tied directly to the number of periods in the undulator. Synchrotrons, both superconducting and nonsuperconducting, designed specifically for lithography, are available commercially and can be provided with undulators. The following zone-plate-array design is based on the specifications of an undulator designed by Sumitomo Heavy Industries of Tokyo, Japan.

As an exemplary goal of the invention, a minimum feature size of 25 nm is taken and referred to as the pixel size. The minimum focal spot size of a zone plate is approximately equal to the width of the outermost zone, i.e., half the pitch of the outermost zones. Hence, to achieve the exemplary goal this must also be 25 nm. Taking the pitch of the outermost zones as p=50 nm, and $\lambda$=4.5 nm, $\sin\theta$=0.09, according to equation (3). Making the approximation $\sin\theta = \tan\theta$, the result is $\lambda/p = R_N/f$. Substituting for f in equation (2) and solving for $R_N$, the following is obtained:

$$R_N = Np. \qquad (5)$$

For N=35 to 100 and p=50 nm, the zone plate diameter is in the range 3.5 to 10 $\mu$m. Substituting equation (5) into equation (2), the focal length is given by $$f = Np^2/\lambda, \qquad (6)$$

which is within 0.2% accuracy. Thus, f is in the range 19 to 56 $\mu$m, a significant improvement over the sub-1 $\mu$m gap that would be required in conventional x-ray lithography at this feature size and 4.5 nm wavelength. Taking 25 nm for the pixel size and, for simplicity, ignoring the space taken up by the joists in FIG. 1 (their function is to provide rigidity and they may not be needed) the number of pixels per unit cell is given by $$\text{pixels per unit cell} = D^2/(p/2)^2 = 16N^2. \qquad (7)$$

Accordingly, there are $<1.6\times10^5$ pixels per unit cell.

The focal spot of a zone plate will be smeared out beyond its diffraction-limited value of p/2 because of the angular divergence of the source (i.e., non-perfect collimation). By straightforward geometry, one can show that the focal spot is enlarged by the factor G, given by $$G = 1 + (2Np\Delta\phi/\lambda). \qquad (8)$$

where $\Delta\phi$ is the source divergence. Taking the value provided by a commercial (Sumitomo Heavy Industries) undulator, $\Delta\phi = 2.8\times10^{-4}$ rad, N=50, p=50 nm, and $\lambda$=4.5 nm, it is found that the focal spot is smeared out by the factor 1.3, i.e., from about 25 nm to 33 nm.

Throughput is a critical consideration in lithography for manufacturing. The limit on throughput imposed by the incident x-ray flux is first calculated, and then the problem of multiplexed parallel addressing of the micromechanical shutters is considered. Although undulators installed at existing synchrotron facilities can provide adequate flux, a type of undulator that could be installed on a compact synchrotron, suitable for manufacturing is instead considered. For example, a "microundulator" with a period of 14 mm, installed on the Aurora 2 synchrotron manufactured by Sumitomo Heavy Industries (Tokyo, Japan), would provide a first-order peak at 4.5 nm, and a flux of $1.97\times10^{15}$ photons/s, or 87 mW, in a 2% bandwidth, suitable for diffraction-limited focusing by zone plates of ~50 zones.

The power incident on a resist-coated substrate, P', is given by $$P' = P \in (\pi/4)(F), \qquad (9)$$

where $\in$ is the efficiency of first-order focusing of the zone plate, and F accounts for loss due to various factors, including the fraction of area taken up by the joists depicted in FIG. 1 and the attenuation of the membrane 106 supporting the zone plate array. The membrane can be made of diamond or other strong carbonaceous material. It is assumed that F=0.9. As discussed below, assuming $\in$=0.31, in which case P'=19mW, which is spread out to fill the zone-plate array. For a resist with a sensitivity of 19 mJ/cm$^2$, a maximum throughput of 1 cm$^2$/s is predicted.

A resist sensitivity of 19 mJ/cm$^2$ corresponds to an incident flux of 4.3 photons/nm$^2$, or ~2700 photons per pixel (25×25nm).

If 50 % of the incident radiation is absorbed in a 100 nm-thick resist film, this corresponds to 950J/cm³, which is approximately the sensitivity of PMMA.

Up to the point where the undulator flux is the limiter, the throughput T is given by $$T = d^2 RM, \tag{10}$$

where d is the pixel diameter, R is the rate at which micromechanical shutters can be switched, and M is the number of shutters that can be addressed in parallel. Since the shutters will have very small masses, it should be possible to switch them at rates of several megahertz. If one assumes 10 MHz switching and d=25 nm, T=6.3×10⁻⁵ Mcm²/s. Thus, the throughput will take on the maximum value of 1 cm²/s, set by the undulator flux, if 16,000 zone-plate shutters are addressed and multiplexed in parallel (i.e., an array of 126×126). The area occupied by 16,000 unit cells (ignoring joist area) is <1.3×1.3 mm. Accordingly, it may be possible to avoid use of joists except on the perimeter of the zone plate array.

The addressing of the individual shutters can be done either by electrical wiring to each or by means of optically addressed photodiodes, one associated with each shutter or mirror. The specific mode of such multiplexed addressing, and the associated software to coordinate the scanning and the multiplexing, is considered as being understood by those of skill in the art.

Electron-beam lithography provides the optimal path to fabricating zone plates. One such technique is described by Anderson et al., J. Vac. Sci. Technol. B 13, 2529 (1995), and is well known to those skilled in the art. Outer zone widths of 30 nm have been achieved by Anderson and colleagues.

Figure 4A:
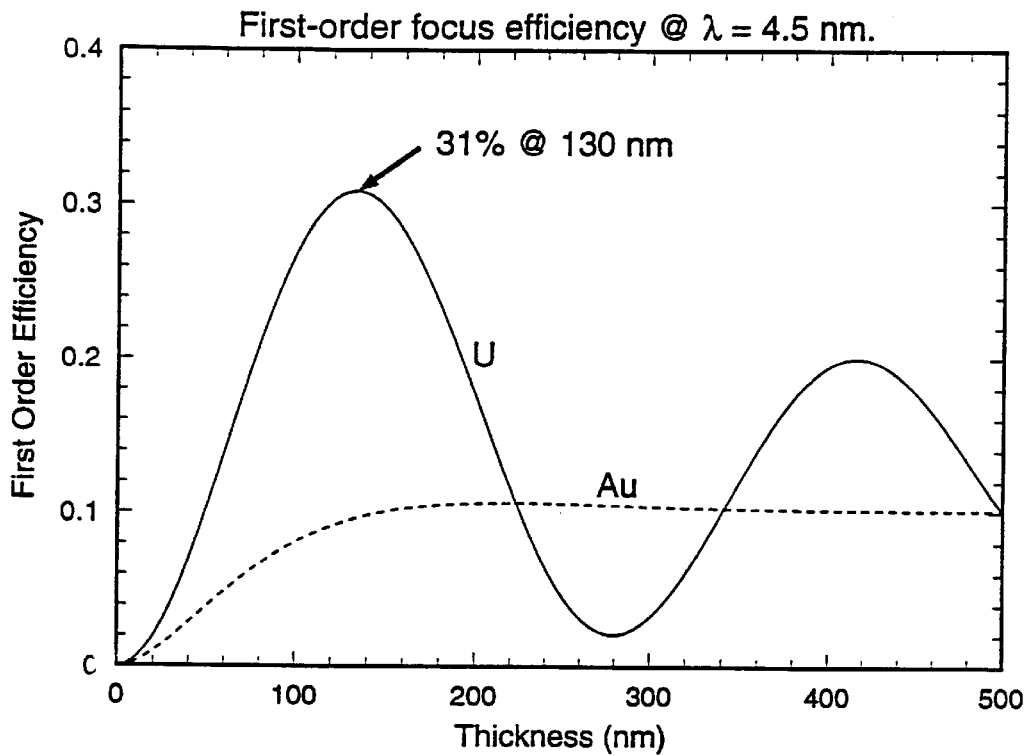
FIG. 4A is a plot of the fraction of incident 4.5 nm x-ray radiation focused in the first-order focal spot.

FIG. 4A is a plot of the first-order efficiency of zone plates made of uranium (U) and gold (Au) as a function of the thickness of the absorber. Note that the efficiency of a gold zone plate never exceeds 10%, whereas the efficiency of zone plates made of uranium reaches a maximum of 31% at a uranium thickness of 130 nm. This is due to uranium being a nearly ideal phase shifter at $\lambda$=4.5 nm.

Figure 4B:
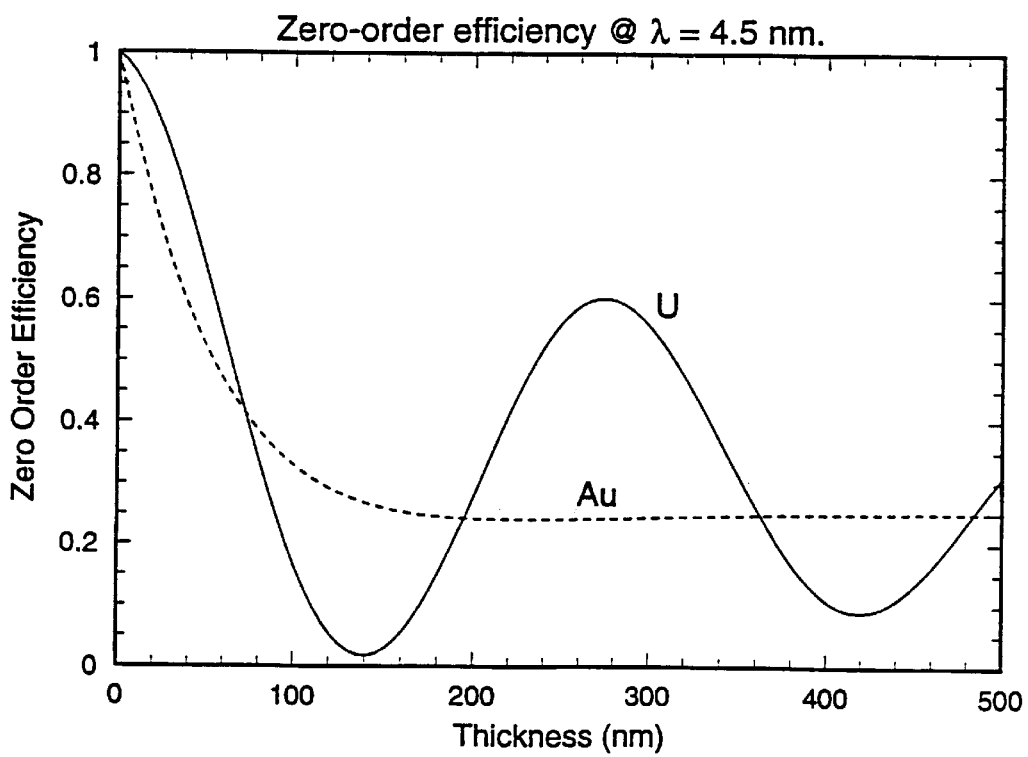
FIG. 4B is a plot of the zero-order efficiency at 4.5 nm wavelength.

This is further illustrated in the plot of FIG. 4B in which the zero order (i.e., the radiation that is propagated straight ahead and produces a background exposure) is attenuated about 98% at 130 nm thickness of uranium. Spent uranium is available in large quantities. Its fluoride $UF_6$ is a gas, hence the material can be reactively etched in fluorocarbon plasmas, presumably at high resolution and aspect ratios compatible with the 130 nm thickness.

It is evident that those skilled in the art may now make numerous uses and modification of and departures from the exemplary embodiments described herein without departing from the inventive concepts. For example, it will be obvious to anyone skilled in the art that since Fresnel zone plates work over the entire electromagnetic spectrum, and even for material particles such as atoms, one may employ this invention with other radiations and for the generation of patterns with feature sizes much larger or finer than the high resolution features described herein.

For the purpose of focusing material particles such as atoms, the Fresnel zone plates would include concentric rings of opaque material, e.g., silicon nitride, with empty space in between the concentric rings. The entire zone plate array would be supported by an array of radial struts which serve to hold the zone plates together as is known in the art. These zone plates are referred to as "free standing" zone plates and would typically be approximately 100 nm thick. Atoms, molecules and clusters of atoms have been diffracted by free standing gratings made with thin low stress silicon nitride. Such a configuration does not significantly detract from the focusing properties of the zone plates.

Consequently, the invention is to be construed as embracing each and every novel feature and novel combination of features present in or possessed by the apparatus and techniques herein disclosed and limited solely by the spirit and scope of the appended claims.

What is claimed is:

1. A maskless lithography system comprising an array of Fresnel zone plates which focus an energy beam into an array of images in order to create a permanent pattern on an adjacent substrate.

2. The system of claim 1, wherein said array of images comprise an array of focal points.

3. The system of claim 2 further comprising means for modulating individual ones of said array of focal points.

4. The system of claim 3, wherein said modulating means operates to selectively shut off and on said focal points.

5. The system of claim 3, wherein said modulating means are positioned between a source of said energy beam and said array of Fresnel zone plates.

6. The system of claim 3, wherein said modulating means are positioned between said array of Fresnel zone plates and said substrate.

7. The system of claim 3, wherein said modulating means comprises micromechanical shutters.

8. The system of claim 3, wherein said modulating means comprises micromechanical mirrors.

9. The system of claim 2, wherein said focal points are directed to said substrate adjacent to said array of Fresnel zone plates.

10. The system of claim 9, wherein said substrate comprises a silicon wafer.

11. The system of claim 1, wherein said energy beam comprises electromagnetic radiation.

12. The system of claim 1, wherein said energy beam comprises atomic particles.

13. The system of claim 1, wherein said array of Fresnel zone plates are arranged on a carbonaceous membrane.

14. The system of claim 13, wherein said membrane is supported by support members that extend from said membrane.

15. The system of claim 1, wherein said array of Fresnel zone plates are arranged on a glass membrane.

16. A maskless lithography system comprising:
   a source of an energy beam; and
   an array of Fresnel zone plates which focus said energy beam into an array of focal points on a substrate to create an image corresponding to a permanent pattern thereon.

17. The system of claim 16 further comprising means for modulating individual ones of said array of focal points.

18. The system of claim 17, wherein said modulating means operates to selectively shut off and on said focal points.

19. The system of claim 17, wherein said modulating means are positioned between a source of said energy beam and said array of Fresnel zone plates.

20. The system of claim 17, wherein said modulating means are positioned between said array of Fresnel zone plates and said substrate.

21. The system of claim 17, wherein said modulating means comprises micromechanical shutters.

22. The system of claim 17, wherein said modulating means comprises micromechanical mirrors.

23. The system of claim 16, wherein said energy beam comprises electromagnetic radiation.

24. The system of claim 16, wherein said energy beam comprises atomic particles.

25. The system of claim 16, wherein said substrate comprises a silicon wafer.

26. The system of claim 16, wherein said array of Fresnel zone plates are arranged on a carbonaceous membrane.

27. The system of claim 26, wherein said membrane is supported by support members that extend from said membrane.

28. The system of claim 16, wherein said array of Fresnel zone plates are arranged on a glass membrane.

29. A method of maskless lithography comprising:

providing an energy beam which creates an image on a substrate;

focusing said energy beam with an array of Fresnel zone plates which focus said energy beam into an array of focal points on said substrate to create said image thereon; and modulating individual ones of said array of focal points.

30. An array of Fresnel zone plates for use in maskless lithography, said array of Fresnel zone plates being arranged on a membrane and operable for focusing an energy beam into an array of focal points on a substrate in order to create a permanent pattern thereon.

* * * * *

US005900637C1

(12) EX PARTE REEXAMINATION CERTIFICATE (7528th)

United States Patent
Smith

(10) Number: US 5,900,637 C1
(45) Certificate Issued: May 25, 2010

(54) MASKLESS LITHOGRAPHY USING A MULTIPLEXED ARRAY OF FRESNEL ZONE PLATES

(75) Inventor: Henry I. Smith, Sudbury, MA (US)

(73) Assignee: Massachusetts Institute of Technology, Cambridge, MA (US)

Reexamination Request:
No. 90/006,470, Dec. 2, 2002

Reexamination Certificate for:
Patent No.: 5,900,637
Issued: May 4, 1999
Appl. No.: 08/866,550
Filed: May 30, 1997

(51) Int. Cl.
*G03F 7/20* (2006.01)

(52) U.S. Cl. .................................. 250/492.22; 378/34
(58) Field of Classification Search .................. None
See application file for complete search history.

(56) References Cited

U.S. PATENT DOCUMENTS

| | | | |
|---|---|---|---|
| 4,895,790 A | * 1/1990 | Swanson et al. | 430/321 |
| 4,992,656 A | * 2/1991 | Clauser | 250/251 |
| 5,589,983 A | * 12/1996 | Meyers et al. | 359/565 |
| 6,133,986 A | 10/2000 | Johnson | |

FOREIGN PATENT DOCUMENTS

JP 06180398 A * 6/1994

OTHER PUBLICATIONS

Bass et al., ed., Handbook of Optics, vol. II, Devices, Measurements, and Properties, Second Edition, (1995), pp. 7.18–7.27.*
Kirz, "Phase zone plates for x rays and the extreme uv", Journal of the Optical Society of America, vol. 64, No. 3, Mar. 1974, pp. 301–309.*
Ferrera et al., "Spatial–phase–locked electron–beam lithography: Initial test results", Journal of Vacuum Science Technology B, vol. 11, No. 6, Nov./Dec. 1993, pp. 2342–2345.*
"A Maskless X–ray Projection Pattern Generator" by Henry I. Smith; Massachusetts Institute of Technology, Cambridge, MA; pp. 179–180.
U.S. Appl. No. 60/012,4364, filed Feb. 28, 1996 by Johnson.

* cited by examiner

Primary Examiner—Zoila E. Cabrera

(57) ABSTRACT

An array of Fresnel zone plates is illuminated by parallel beamlets of narrow-band electromagnetic radiation. The individual zone plates focus a significant fraction of the incident radiation to foci on a substrate located at least several micrometers distant. The beamlets are capable of being individually turned on or off by shutters, or by deflecting small mirrors that would otherwise direct a beamlet to its Fresnel zone plate. Pattern generation is accomplished by moving the substrate while multiplexing the individual beamlets on or off.

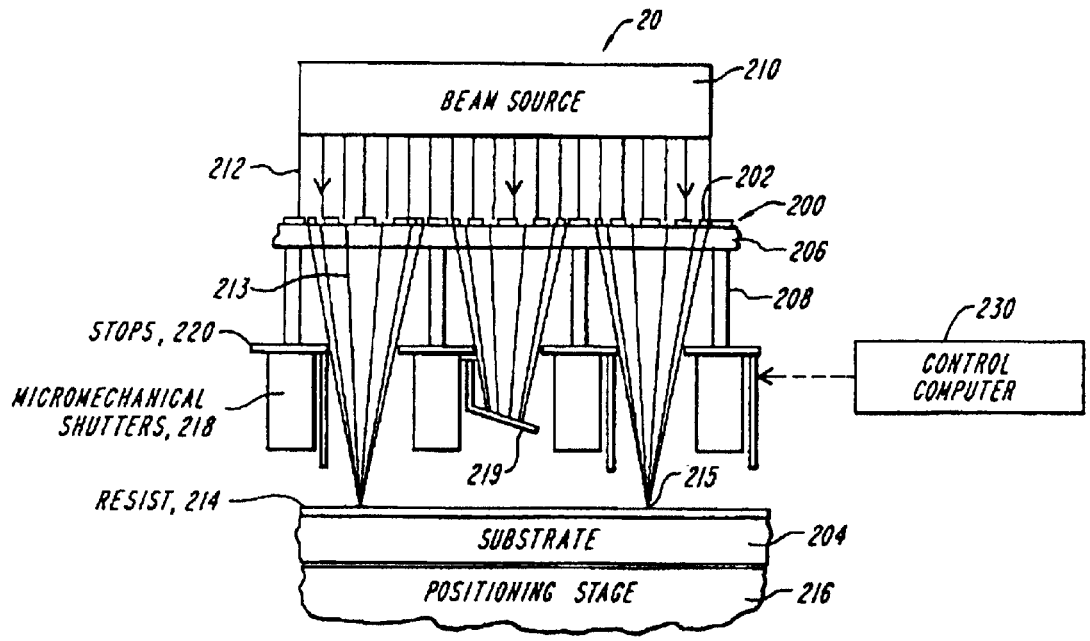

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

Claims 1-30 are cancelled.

\* \* \* \* \*